United States Patent
Hsu et al.

(10) Patent No.: US 8,114,762 B2
(45) Date of Patent: Feb. 14, 2012

(54) METHOD FOR MANUFACTURING TRENCH MOSFET DEVICE WITH LOW GATE CHARGE

(75) Inventors: Hsiu-Wen Hsu, Hsinchu County (TW); Chun Wei Ni, Taipei (TW); Kao-Way Tu, Jhonghe (TW)

(73) Assignee: Niko Semiconductor Co., Ltd., Taipei (TW)

(*) Notice: Subject to any disclaimer, the term of this patent is extended or adjusted under 35 U.S.C. 154(b) by 304 days.

(21) Appl. No.: 12/453,281

(22) Filed: May 6, 2009

(65) Prior Publication Data
US 2010/0171171 A1 Jul. 8, 2010

(30) Foreign Application Priority Data
Jan. 7, 2009 (TW) .................................. 98100327 A

(51) Int. Cl.
*H01L 21/3205* (2006.01)
*H01L 21/44* (2006.01)
(52) U.S. Cl. ........ 438/589; 438/270; 438/425; 257/326; 257/330
(58) Field of Classification Search .................. 438/425, 438/589; 257/326, 330, E21.158, E29.262
See application file for complete search history.

(56) References Cited

U.S. PATENT DOCUMENTS

| | | | | |
|---|---|---|---|---|
| 7,098,122 | B2 * | 8/2006 | Gonzalez | 438/589 |
| 7,851,312 | B2 * | 12/2010 | Grivna | 438/279 |
| 2006/0060919 | A1 * | 3/2006 | Chang | 257/347 |
| 2007/0215931 | A1 * | 9/2007 | Kianian et al. | 257/315 |
| 2008/0227269 | A1 * | 9/2008 | Ma | 438/425 |

* cited by examiner

*Primary Examiner* — Phuc Dang
(74) *Attorney, Agent, or Firm* — Rosenberg, Klein & Lee

(57) ABSTRACT

A method for manufacturing trench MOSFET device with low gate charge includes the steps of providing a substrate of first conductivity type; forming an epitaxial layer of first conductivity type on the substrate; forming a body region of second conductivity type in the epitaxial layer, the body region extends downwards from the surface of the epitaxial layer; forming a plurality of trenches in the epitaxial layer, the body region having the trenches formed therethrough; forming a first insulating layer on the body region and on an inner surface of each trench; forming a ploy-silicon spacer on the first insulating layer on an inner side-wall of each trench; filling a dielectric structure in the lower portion of each trench; and filling a ploy-silicon structure on top of the dielectric structure in each trench. Through the trench MOSFET device, the gate capacitance and resistance thereof are reduced so the performance is increased.

10 Claims, 11 Drawing Sheets

METHOD FOR MANUFACTURING TRENCH MOSFET DEVICE WITH LOW GATE CHARGE

BACKGROUND OF THE INVENTION

1. Field of the Invention

The present invention relates to a method for manufacturing trench MOSFET device and the structure thereof, in particular, to a method for manufacturing trench MOSFET device with low gate charge.

2. Description of Related Art

Trench metal-oxide-semiconductor (MOS) device includes a gate electrode inside a trench which extends downward from a surface of the semiconductor substrate. The current flow by the gate electrode of the trench MOS device is substantially along a vertical direction. Therefore, cell pitch of the MOS devices can be reduced. In present, there are various MOS devices available in the market, such as metal-oxide-semiconductor field-effect transistor (MOSFET), insulated-gate bipolar transistor (IGBT), thryistor, and so on.

As the operating frequency of the power switching devices such as MOSFET increased, improvement of switching efficiency becomes more and more important. How to design a switching device with improved switching rate and reduced switching loss has become an object in the industry. In view of the characteristics of semiconductors, switching rate and switching loss can be improved by lowering the capacitance between gate and drain (Cgd).

In a conventional MOSEFT device, the trenches are filled with ploy-silicon material which acts as the gate, and the ploy-silicon material is disposed on the bottom and the side-wall of the trenches. The capacitance between gate and drain of the MOSFET device depends on the bottom area of the trenches. The size of the bottom area can be decreased by using a narrower gate to improve switching loss for high frequency applications. However, the narrower gate may result in a greater gate resistance to cause energy loss.

SUMMARY OF THE INVENTION

In view of the aforementioned issues, the present invention provides a method for manufacturing trench MOSFET device with low gate charge (Qgd), which is capable to reduce the overlapped area between the poly-silicon gate and the bottom surface of the trench so as to lower down capacitance between the gate and the drain (Cgd) as well as gate charge (Qgd). Furthermore, a metal-salicide layer with lower resistivity is provided for compensating the rising of gate resistance due to a smaller cross-section area of the poly-silicon gate. Accordingly, a trench MOSFET device with low switching loss is provided.

The present invention provides a manufacturing method of the trench MOSFET device. The method includes the steps of providing a substrate of first conductivity type; forming an epitaxial layer of first conductivity type on the substrate; forming a body region of second conductivity type in the epitaxial layer, and the body region extending downward from an upper surface of the epitaxial layer; forming a plurality of trenches in the epitaxial layer and penetrating the body region; forming a first insulating layer on an inner surface of the trench; forming a ploy-silicon spacer on the first insulating layer at a side-wall of the trench; forming a dielectric structure in a lower portion of the trench; and filling the trench with a ploy-silicon structure, the poly-silicon structure being disposed on the dielectric structure and connecting with the ploy-silicon spacer.

The present invention provides another manufacturing method of the trench MOSFET device. The method includes the steps of providing a substrate of first conductivity type; forming an epitaxial layer of first conductivity type on the substrate; forming a body region of second conductivity type in the epitaxial layer, and the body region extending downwards from an upper surface of the epitaxial layer; forming a plurality of trenches in the epitaxial layer and penetrating the body region; forming a first insulating layer on an inner surface of the trench; forming a ploy-silicon spacer on the first insulating layer at a side-wall of the trench; and forming a metal-salicide layer on the ploy-silicon spacer.

The present invention further provides a trench MOSFET device. The trench MOSFET device includes a substrate; an epitaxial layer disposed on the substrate; a body region extending downwards from an upper surface of the epitaxial layer; a plurality of trenches located in the epitaxial layer and penetrating the body region; a first insulating layer located on an inner surface of the trench; and a ploy-silicon spacer located on the first insulating layer at a side-wall of the trench.

As mentioned above, formation of the ploy-silicon spacer on the side-wall of the trench is capable for restricting the overlapped area between the poly-silicon gate and the bottom surface of the trench. The rising resistance due to a smaller cross-section area of the poly-silicon gate can be compensated by the metal-salicide layer with lower electric resistivity on the poly-silicon spacer or an extra poly-silicon structure connected to the ploy-silicon spacer. Therefore, the trench MOSFET device in the present invention can be adopted in the situation of increased switching rate and the switching loss can be reduced to improve the operational efficiency. That is, the trench MOSFET device of the present invention is suitable for high frequency application.

In order to further understand the techniques, means, and effects the present invention takes for achieving the prescribed objectives, the following detailed descriptions and appended drawings are hereby referred, such that, through which, the purposes, features, and aspects of the present invention can be thoroughly and concretely appreciated; however, the appended drawings are merely provided for reference and illustration, without any intention to be used for limiting the present invention.

DETAILED DESCRIPTION OF THE PREFERRED EMBODIMENTS

The present invention provides a trench MOSFET device with low gate charge and a method for manufacturing the same. The manufacturing method of the present invention has the ploy-silicon spacer formed in the trench for decreasing the overlapped area between the ploy-silicon gate and the bottom surface of the trench and adopts metal-salicide with low electric resistivity so as to achieve the objects of lowering the capacitance between the gate and the drain (Cgd) as well as the gate resistance. Therefore, switching loss of the trench MOSFET device can be reduced. Please refer to FIGS. 1A to 1M, the first embodiment of the manufacturing method according to the present invention is shown. The manufacturing method includes the following steps.

Figure 1A:
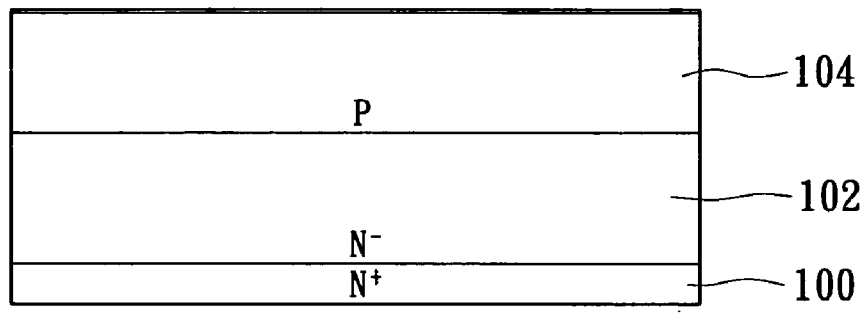
FIGS. 1A-1M are schematic views showing the first embodiment of the manufacturing method of the trench MOSFET device according to the present invention.

Firstly, as shown in FIG. 1A, a substrate 100 of first conductivity type is provided. An epitaxial layer 102 of first conductivity type is formed on the substrate 100 and a body region 104 of second conductivity type is formed in the upper portion of the epitaxial layer 102 by ion-implantation and diffusion processes. Thus, the body region 104 extends downwards from an upper surface of the epitaxial layer 102 to the interior of the epitaxial layer 102. In this embodiment, the first conductivity type is N-type and the second conductivity type is P-type. The substrate 100 is an N+ substrate, the epitaxial layer 102 is an N-type epitaxial layer, and the body region 140 is a P-type body region.

Figure 1B:
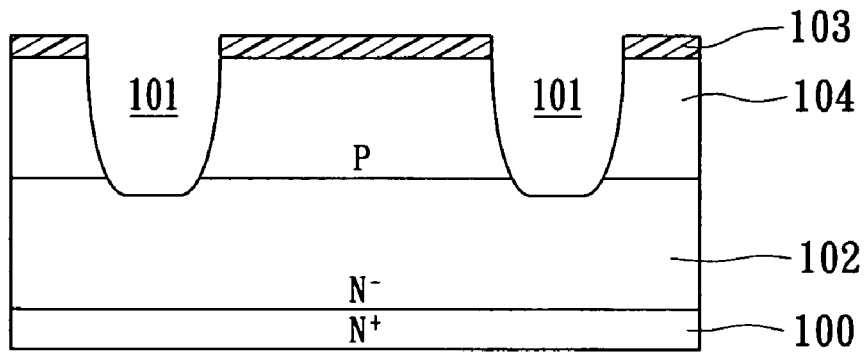

Then, as shown in FIG. 1B, a plurality of trenches 101 is formed in the epitaxial layer 102. Each trench 101 extends from the upper surface of the body region 104 downward to penetrate the body region 104. In other words, the body region 104 has the trenches 101 formed therethrough. In the present embodiment, a pattern layer 103 is firstly formed on the body region 140 to define the location of the trenches 101 and then an etching process (such as a RIE etching process) is carried out for forming the trenches 101. In addition, the trenches 101 penetrate the body region 104 so as to have the bottom of the trench 101 located in the P-type epitaxial layer 102 under the body region 104. The shapes of the side-wall of the trench 101 can be varied without affecting the manufacturing method of the present invention. For example, the side-wall of the trenches 101 can be a planar vertical side-wall or a curved side-wall.

Figure 1C:
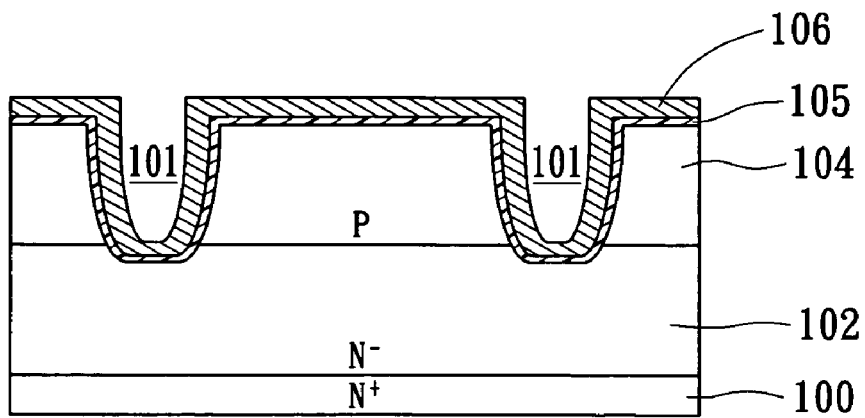

Afterward, referring to FIG. 1C, after removing the pattern layer 103, a first insulating layer 105 is formed over all the exposed surfaces including the upper surface of the body region 104 and an inner surface of the trench 101. The first insulating layer 105 can be utilized as a gate dielectric layer.

Figure 1D:
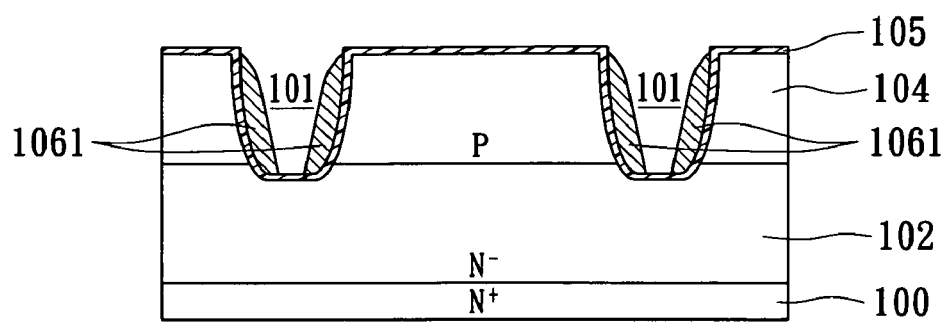

Then, as shown in FIGS. 1C and 1D, a continuous ploy-silicon layer 106 is deposited on the body region 104 and the inner surface of the trench 101. The continuous ploy-silicon layer 106 is located on the first insulating layer 105. Then, the ploy-silicon layer 106 is etched by using an anisotropic etching process to form the ploy-silicon spacer 1061 on the first insulating layer 105 at the side-wall of the trench 101. It is noted that the above mentioned etching step does not need a lithographic process to define the location of the poly-silicon spacer 1061. Furthermore, after the etching step, the ploy-silicon spacer 1061 is disposed on the inner side-wall of each trench 101 with a middle part of the bottom surface of the trenches 101 exposed.

In contrast with the poly-silicon gate of the traditional trench MOSFET device, which is formed in the trench and covers the whole bottom of the trench, the ploy-silicon spacer 1061 provided in the present invention only covers a portion of the bottom of the trench. Therefore, the overlapped area between the poly-silicon gate and the bottom surface of the trenches 101 can be decreased so as to reduce the capacitance between gate and drain (Cgd) and the gate charge (Qgd).

Figure 1E:
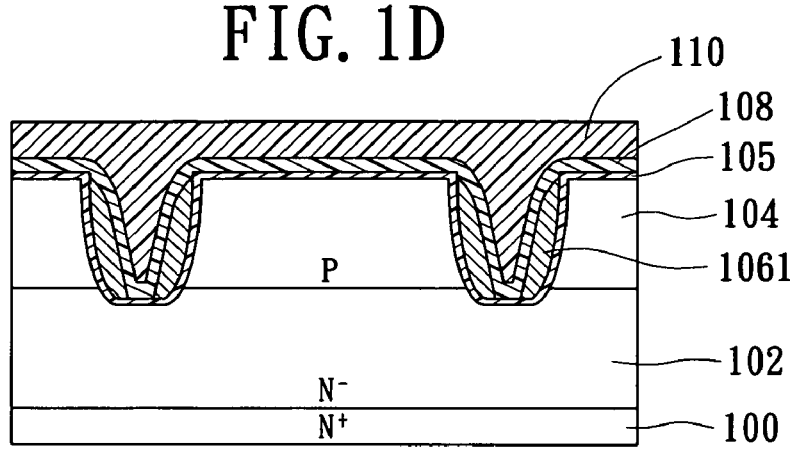
Figure 1F:
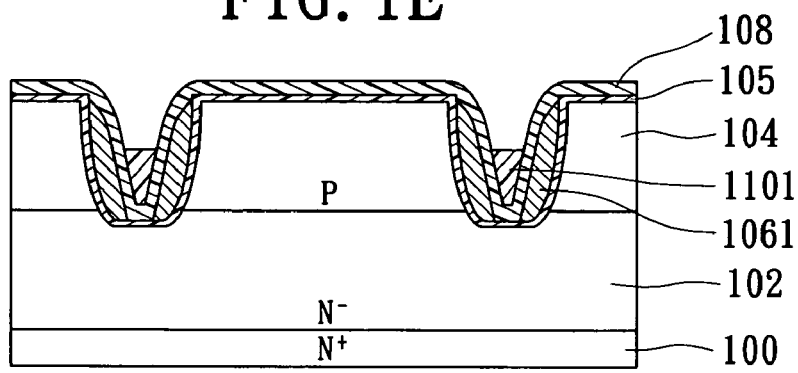
Figure 1G:
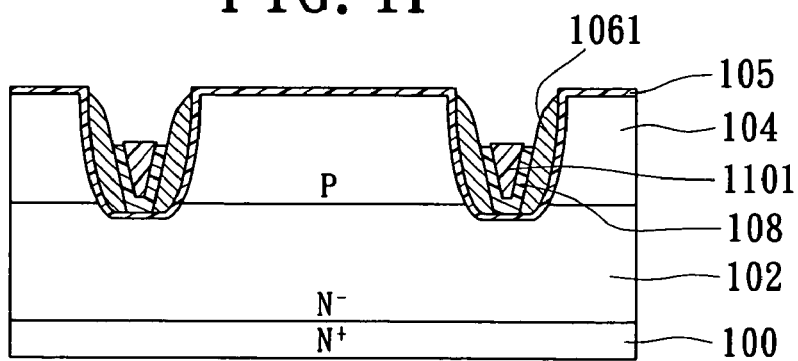

Thereafter, please refer to FIGS. 1E to 1G a dielectric structure 1101 with a predetermined height is formed in the lower portion of the trench 101. In the present embodiment, the dielectric structure 1101 is formed by using the following steps. Firstly, as shown in FIG. 1E, a first dielectric layer 108 is formed along the exposed surface of the body region 104, the exposed surface of the poly-silicon spacer 1061, and the exposed inner surface of the trench 101. The first dielectric layer 108 may be a silicon nitride layer. Then, a second dielectric layer 110 is formed on the first dielectric layer 108 and fills the lower portion of the trench 101. The second dielectric layer 110 is a silicon oxide layer. Thereafter, as shown in FIG. 1F, the second dielectric layer 110 is etched to form the dielectric structure 1101 surrounded by the first dielectric layer 108 in the lower portion of each trench 101. The height of the dielectric structure 1101 can be modified by controlling etching depth in the etching step. In the present embodiment, the predetermined height of the dielectric structure 1101 is preferably half or more that half of the depth of the trench 101. For example, as the depth of the trench 101 reaches 1 micron, the predetermined height of the dielectric structure 1101 is restricted to no more than 5000 Angstrom.

With regard to the etching process for forming the dielectric structure 1101, since the thickness of the dielectric structure 1101 in the present invention is much larger than the bottom oxide of the typical trench MOSFET structure, the acceptable error of etching depth in the process of forming the dielectric structure 1101 in the present invention is much larger than that of forming the bottom oxide of the typical trench MOSFET structure. Therefore, the manufacturing method of the present invention is able to withstand a greater variation of etching process.

Then, referring to FIG. 1G, the exposed part of the first dielectric layer 108 is removed and the part of the first dielectric layer 108 located by the dielectric structure 1101 remains. In the present embodiment, the first dielectric layer 108 is a silicon nitride layer and the second dielectric layer 110 is a silicon oxide layer. The first dielectric layer 108 is an etching-stop layer for the step of etching the second dielectric layer 110. However, the scope of the present invention should not be restricted to the above-mentioned material. The two dielectric layers 108,110 can be formed of any different dielectric materials which is capable to be selectively etched.

Figure 1H:
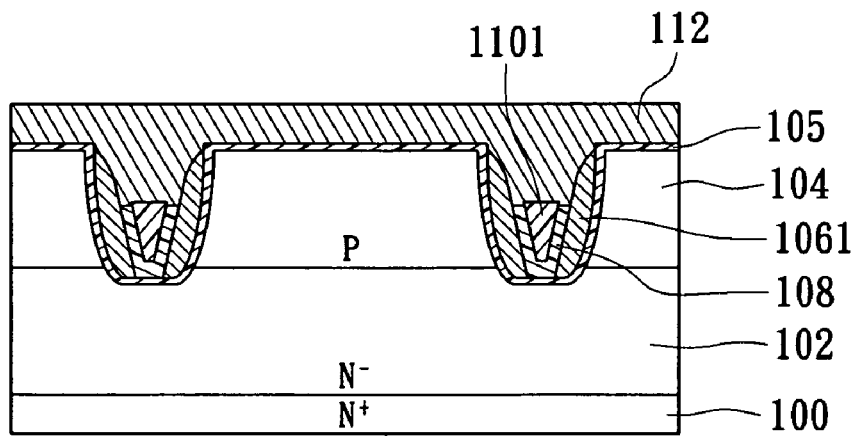
Figure 1I:
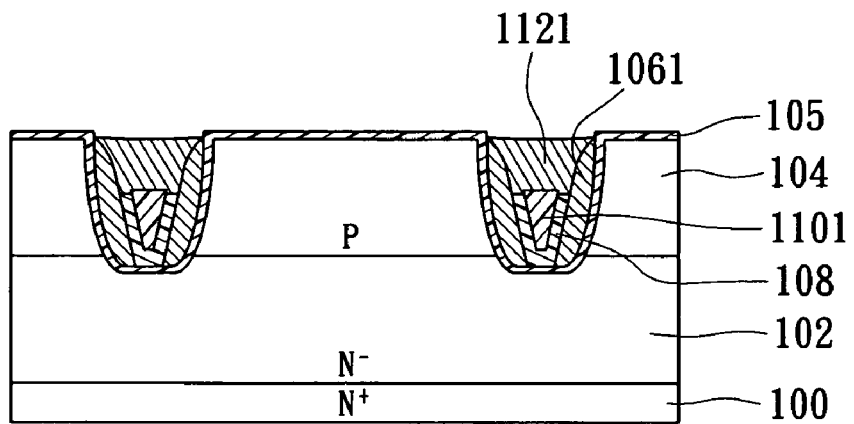

Referring to FIGS. 1H and 1I, a ploy-silicon structure 1121 is filled in the trench 101 to cover the dielectric structure 1101. The poly-silicon structure 1121 is formed by using the following steps. Firstly, a continuous second poly-silicon layer 112 is deposited on the first insulating layer 105, the ploy-silicon spacer 1061, the first dielectric layer 108, and the dielectric structure 1101 in the trench 101. The remaining space in the trench 101 is filled with the second poly-silicon layer 112, as can be seen from FIG. 1H. Then, as shown in FIG. 1I, an etch-back step is carried out to remove the second poly-silicon layer 112 outside the trench 101 but retain the second poly-silicon layer 112 inside the trench 101 so as to form the poly-silicon structure 1121. The cross-section area of the poly-silicon gate in the trench 101 is still large because of the poly-silicon structure 1121 connecting with the ploy-silicon spacer 1061 so that the gate resistance would not increase in the present embodiment.

Figure 1J:
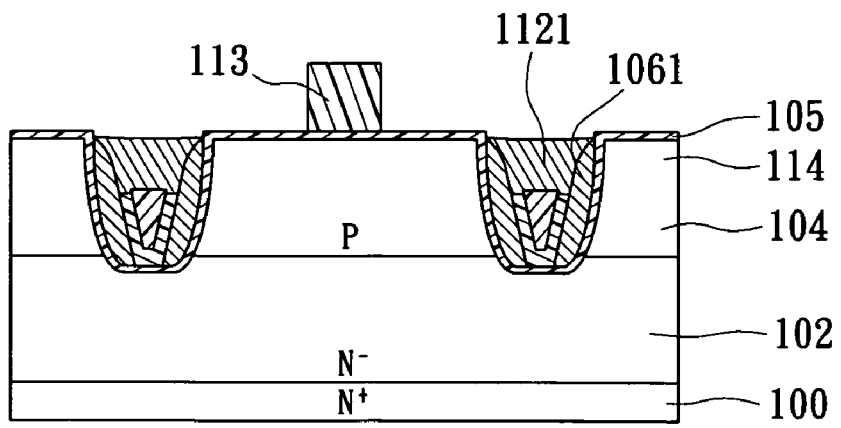
Figure 1K:
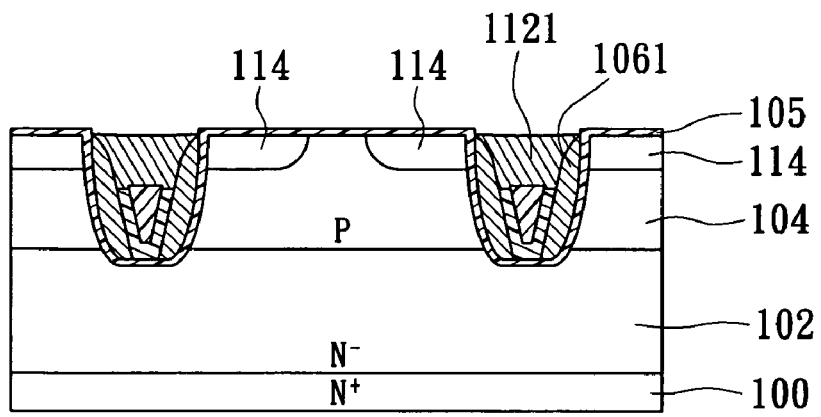

FIGS. 1J and 1K show the processes for forming the source 114 in the body region 104. As shown, a photo-resist pattern 113 is provided for defining the position of the source 114, and then an ion-implantation process is carried out to form the source 114 in the body region 104.

Figure 1L:
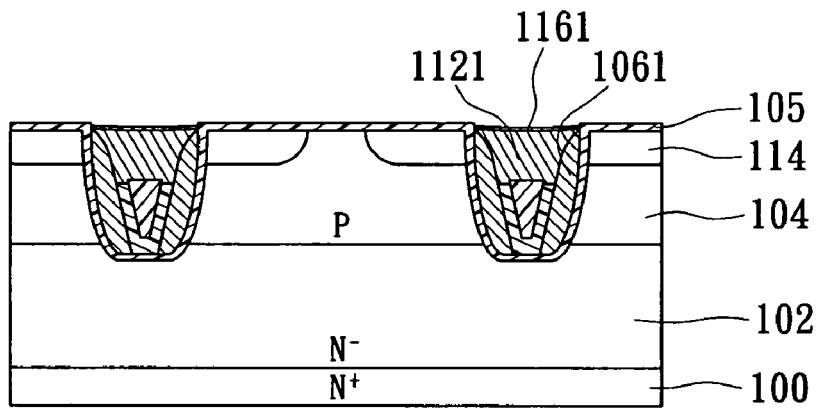
Figure 1M:
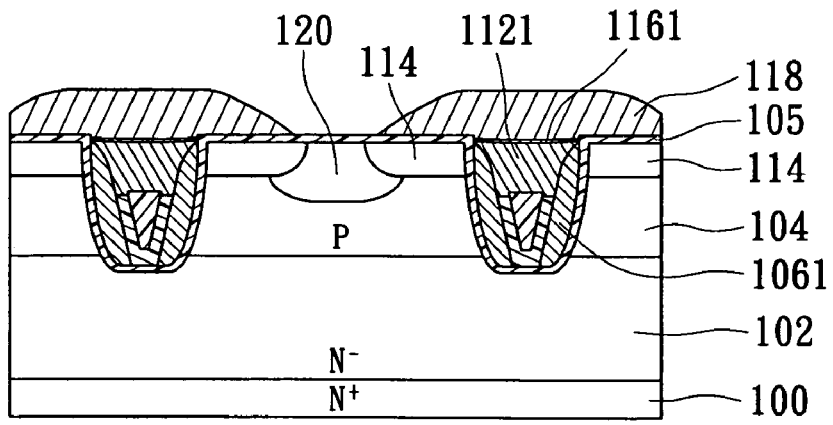

Then, as shown in FIG. 1L, a metal-salicide layer 1161 is formed on the poly-silicon structure 1121. In the present embodiment, the metal-salicide layer 1161 is formed by using the following steps. Firstly, a continuous metal layer is deposited on the body region 104 and the poly-silicon structure 1121. Afterward, a heating step is carried out to have the metal layer react with the poly-silicon structure 1121 to form a metal-salicide layer 1161 on the poly-silicon structure 1121. In the present embodiment, a continuous Ti/TiN layer is formed on the poly-silicon structure 1121 and then a rapid thermal processing (RTP) is used to have the Ti/TiN layer react with the underlying poly-silicon structure to form a C49 phase TiSi layer 1161. Afterward, the excess Ti/TiN material, such as the Ti/TiN layer on the first insulating layer 105, is removed as shown in FIG. 1L.

Afterward, a high temperature phase transformation step is carried out to transform the high resistivity C49 phase TiSi into a low resistivity C54 phase TiSi so as to decrease the resistance of the metal-salicide layer 1161. Therefore, the problem of a rising gate resistance due to the small cross-section area of the ploy-silicon gate including the ploy-silicon spacer 1061 and the ploy-silicon structure 1121 can be solved by the formation of the metal-salicide layer 1161 with a small resistance. In the present embodiment, a RTP step is used for transforming the C49 phase TiSi into the C54 phase TiSi.

Then, a silicate glass structure 118, such as the borophosphorosilicate glass (BPSG) structure, is formed to cover the ploy-silicon spacer 1061 and the ploy-silicon structure 1121 and a heavily doped region 120 is formed in the body region 104 so as to complete the manufacturing method of the power semiconductor devices. The manufacturing method of the present invention can be applied to stri p-cell or closed-cell power semiconductor devices.

In the trench MOSFET device provided by using the manufacturing method of the present embodiment, the overlapped area between the poly-silicon gate and the bottom surface of trench 101 is reduced so as to lower gate to drain capacitance Cgd as well as gate charge Qgd. Meanwhile, the poly-silicon structure 1121 connecting with the poly-silicon spacer 1061 may compensate the problem of the rising gate resistance due to the smaller poly-silicon spacer 1061. In addition, the formation of the low resistivity metal-salicide layer 1161 on the poly-silicon structure 1121 can further reduce the gate resistance. Since switching loss is proportional to the product of gate to drain capacitance and gate resistance, the embodiment of the present invention may reduce switching loss of the trench MOSFET device.

Moreover, the thickness of the dielectric structure 1101 in the present embodiment is rather large. Thus, the variation of etching depth in the etching process would not be an issue when forming the dielectric structure 1101. For example, as the thickness of the dielectric structure 1101 in the present embodiment is 5000 Angstrom and the variation of etching depth in the etching process is about 1000 Angstrom. Thus, the thickness error of the dielectric structure 1101 is about 20%. On the contrary, the bottom oxide layer of the traditional trench MOSFET device is only about 1000 to 2000 Angstrom. The variation of etching depth may induce the thickness error of more than 50%. Thus, the yield of the MOSFET device can not be guaranteed. Accordingly, the manufacturing method of the present invention can withstand the variation of the etching process.

The second embodiment of the manufacturing method according to the present invention is shown from FIGS. 2A to 2I. The manufacturing steps corresponding to FIGS. 2A to 2D of the second embodiment are similar to that of FIGS. 1A to 1D of the first embodiment.

Figure 2A:
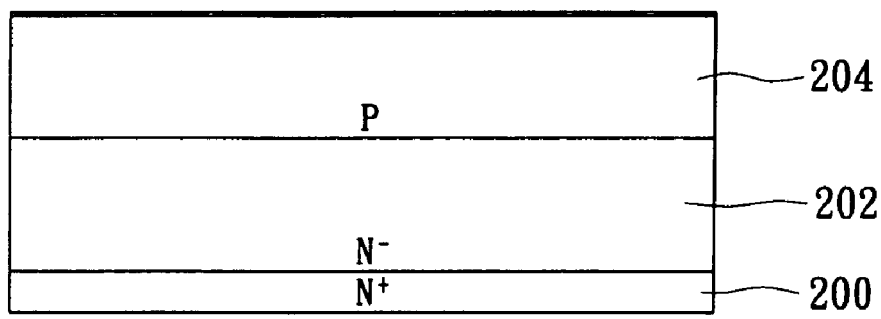
FIGS. 2A-2I are schematic views showing the second embodiment of the manufacturing method of the trench MOSFET device according to the present invention.
Figure 2B:
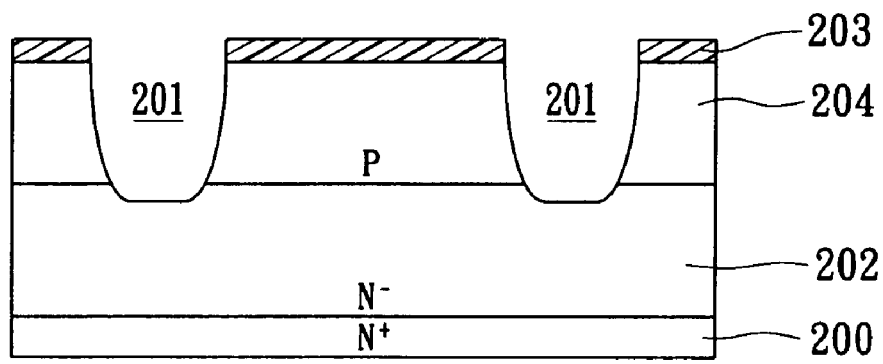

Firstly, as shown in FIG. 2A, a substrate 200 of first conductivity type is provided. An epitaxial layer 202 of first conductivity type is formed on the substrate 200 and a body region 204 of second conductivity type is formed in the upper portion of the epitaxial layer 202 by ion-implantation and diffusion processes. The concentration of doping in the above mentioned structures can be referenced to the first embodiment.

Then, a plurality of trenches 201 is formed in the epitaxial layer 202. The trench 201 extends from an upper surface of the body region 204 downwards for penetrating through the body region 204 as shown in FIG. 1B. After removing the pattern layer 203 for defining the trench 201, a first insulating layer 205 is formed on an inner surface of the trench 201 as shown in FIG. 2C.

Figure 2C:
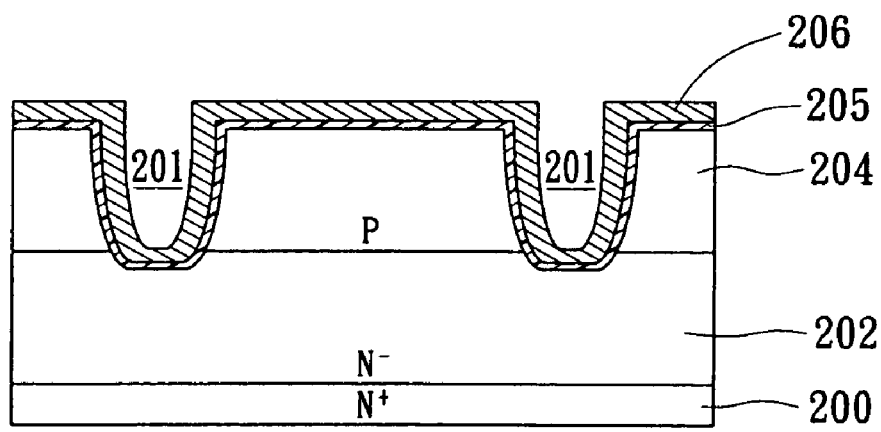
Figure 2D:
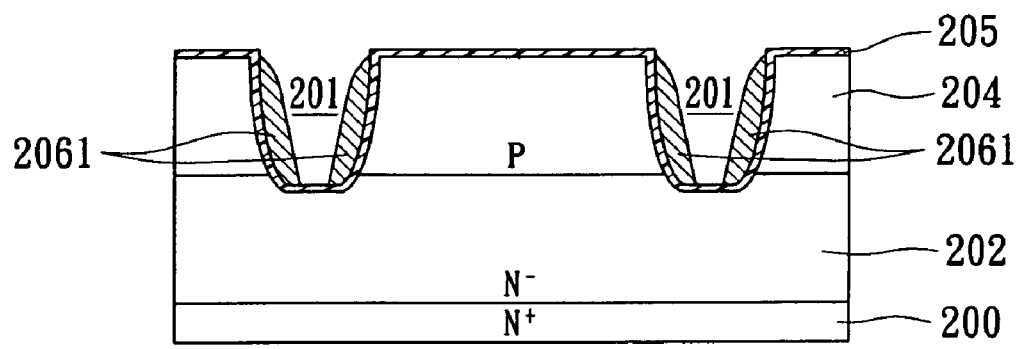

Afterward, as shown in FIGS. 2C and 2D, a continuous ploy-silicon layer 206 is formed on the body region 204 and the inner surface of the trench 201. In other words, the continuous ploy-silicon layer 206 is formed on the first insulating layer 205. Then, the ploy-silicon layer 206 is etched by using an anisotropic etching process so as to form the ploy-silicon spacer 2061 on the first insulating layer 205 at the side-wall of the trench 201. It is noted that the bottom of the trench 201 is partially exposed. Therefore, in contrast with the poly-silicon gate of the traditional trench MOSFET structure, which covers the whole bottom surface of the trench, the ploy-silicon spacer 2061 provided in the present invention is helpful for reducing the overlapped area between the poly-silicon gate and the bottom surface of the trenches 201 so as to reduce capacitance between gate and drain Cgd as well as gate charge Qgd.

Figure 2E:
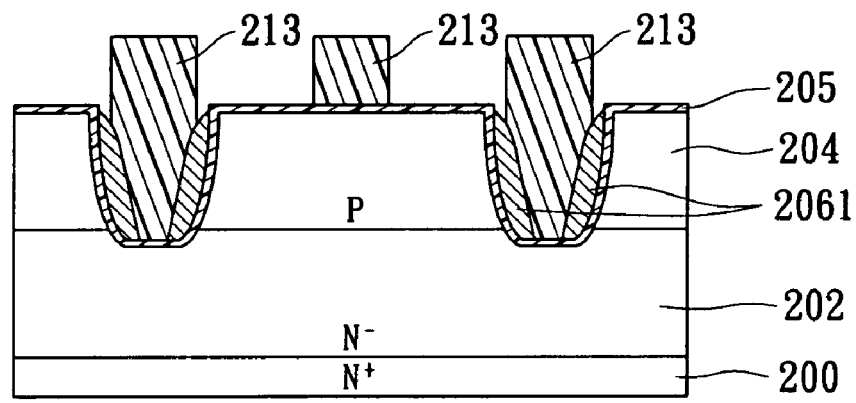

Then, referring to FIG. 2E, a source 214 is formed in the body region 204. In the present step, a photo-resist pattern 213 is firstly formed to cover at least the bottom of the trenches 201, and then, an ion implantation process is carried out to form the source 214 in the body region 204. After the formation of the source 214, the photo-resist pattern 213 is removed.

Figure 2F:
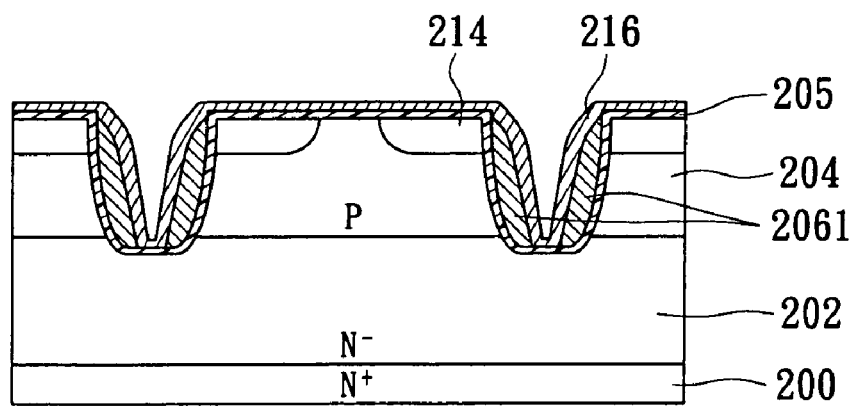
Figure 2G:
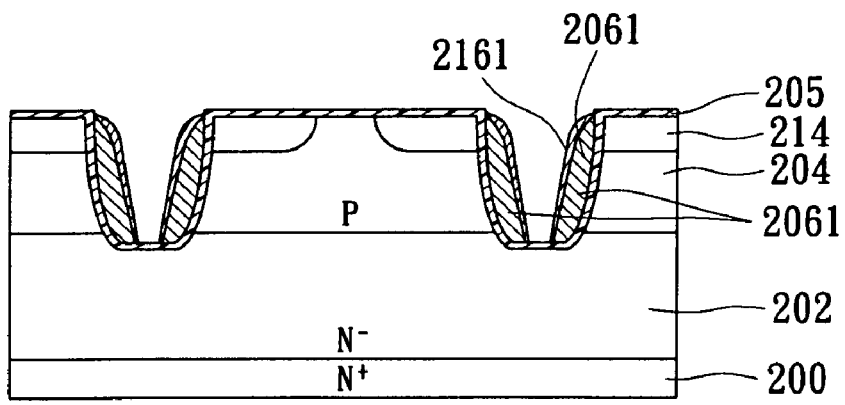

Next, a metal-salicide layer 2161 is formed on the ploy-silicon spacer 2061. The metal-salicide layer 2161 is formed by the following steps. Referring to FIG. 2F, firstly, a continuous metal layer 216 is disposed on the body region 204 and the ploy-silicon spacer 2061. Then, as shown in FIG. 1G, a heating step is carried out to have the metal layer 216 react with the ploy-silicon spacer 2061 to form a metal-salicide layer 2161 on the ploy-silicon spacer 2061. As a preferred embodiment, a continuous metal layer 216 including Ti/TiN can be formed and a rapid thermal processing (RTP) step can be used to form a C49 phase TiSi on the poly-silicon spacer 2061. After the formation of TiSi, referring to FIG. 1G the excess metal layer 216 is removed to leave the TiSi layer 2161 on the poly-silicon spacer 2061.

Thereafter, in order to reduce gate resistance, a high temperature phase transforming step is carried out to transform the C49 phase TiSi into a C54 phase TiSi. Because the resistivity of the C54 phase TiSi is much smaller than that of the C49 phase TiSi, the overall gate resistance can be further reduced to overcome the problem of rising resistance due to the decreased cross-section area of the ploy-silicon gate.

Figure 2H:
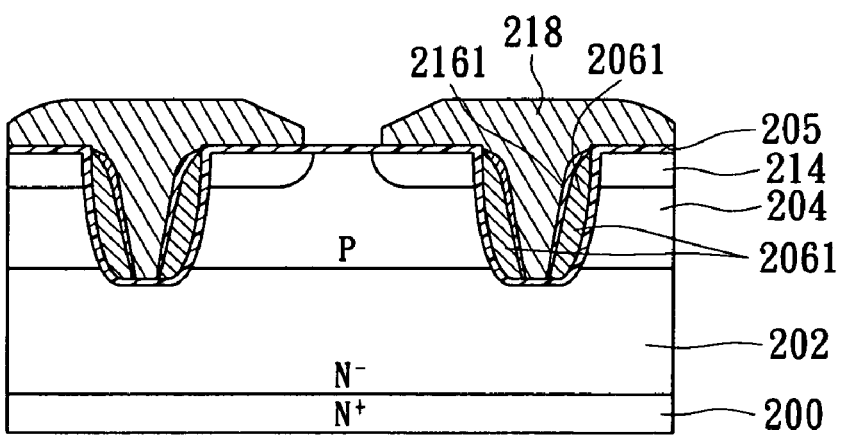
Figure 2I:
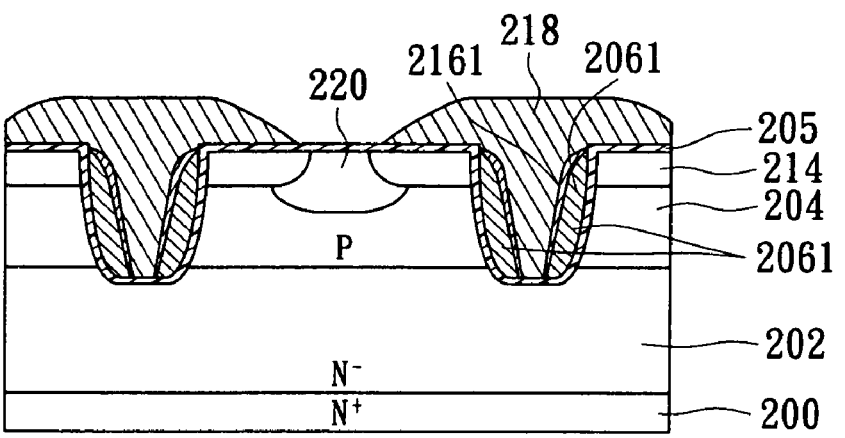

Afterward, as shown in FIG. 2H, a silicate glass structure 218, such as the BPSG structure, is filled into the trenches 201 and covers the ploy-silicon spacer 2061. Then, referring to FIG. 2I, a heavily doped region 220 is formed in the body region 204 so as to complete the formation of the trench MOSFET device. The manufacturing method of the embodiment is preferably applied to strip-cell MOSFET device. In addition, the trench MOSFET device provided in the present embodiment has a reduced overlapped area between the poly-silicon gate and the bottom surface of trenches 201 so as to reduce gate to drain capacitance Cgd as well as gate charge Qgd. Moreover, the rising resistance due to the smaller poly-silicon g ate can be compensated by the metal-salicide layer 2161 on the poly-silicon spacer 2061. Therefore, switching loss of the trench MOSFET device can be improved.

The third embodiment of the manufacturing method provided in the present invention is shown from FIGS. 3A to 3L. Some steps of the present embodiment similar with that of the first and the second embodiments can be referenced to the aforementioned embodiments.

Figure 3A:
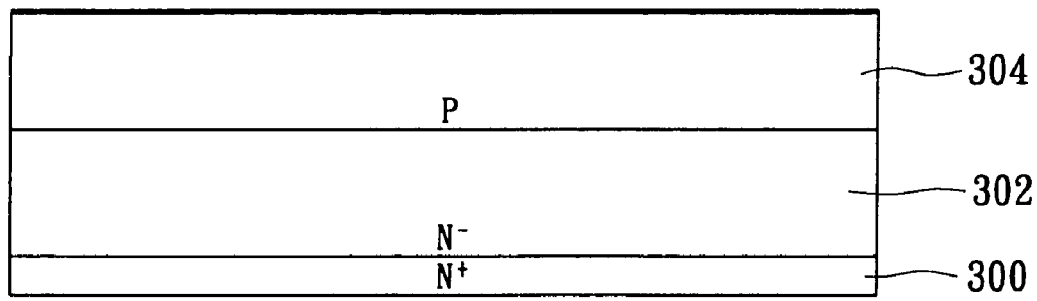
FIGS. 3A-3K are schematic views showing the third embodiment of the manufacturing method of the trench MOSFET device according to the present invention.

Firstly, referring to FIG. 3A, a substrate 300 of first conductivity type is provided. 3A. Afterward, an epitaxial layer 302 of first conductivity type is formed on the substrate 300 and a body region 304 of second conductivity type is formed in the upper portion of the epitaxial layer 302 by ion-implantation and diffusion processes. The concentration of the dopant of each structure can be referenced in the first embodiment.

Figure 3B:
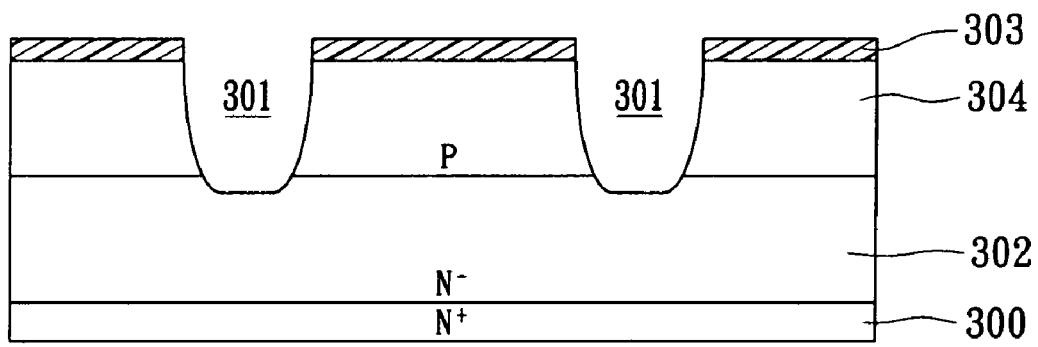

Then, as shown in FIG. 3B, a plurality of trenches 301 is formed in the epitaxial layer 302. The trench 301 extends from the upper surface of the body region 304 downwards for penetrating the body region 304. After removing the pattern layer 303 for defining the trench 301, and a first insulating layer 305 is formed on the body region 304 and an inner surface of the trench 301 as shown in FIG. 3C.

Figure 3C:
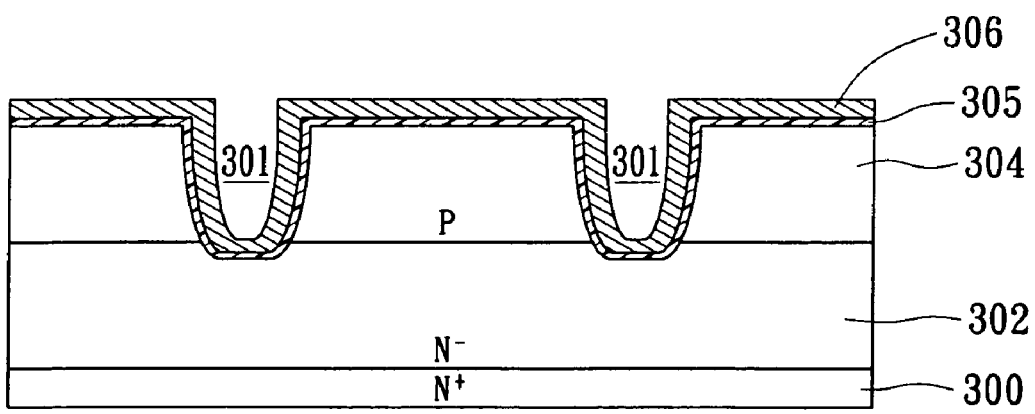
Figure 3D:
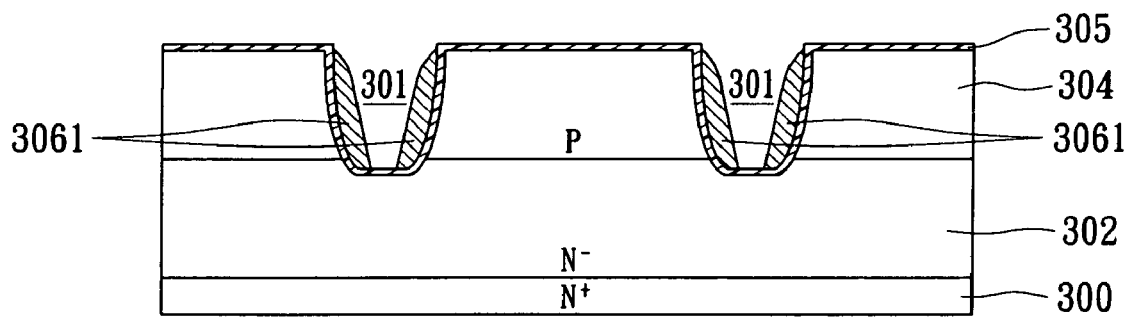

Thereafter, as shown in FIGS. 3C and 3D, a continuous ploy-silicon layer 306 is formed on the body region 304 and the inner surface of each trench 301. Then, the ploy-silicon layer 306 is etched by using an anisotropic etching process so as to leave the ploy-silicon spacer 3061 on the first insulating layer 305 at the side-wall of each trench 301. It is noted that the bottom of the trench 301 is partially exposed as shown in FIG. 3D. Therefore, the ploy-silicon spacer 3061 provided in the present invention is helpful for reducing the overlapped area between the poly-silicon gate and the bottom surface of the trenches 301 so as to reduce capacitance between gate and drain Cgd and gate charge Qgd.

Figure 3E:
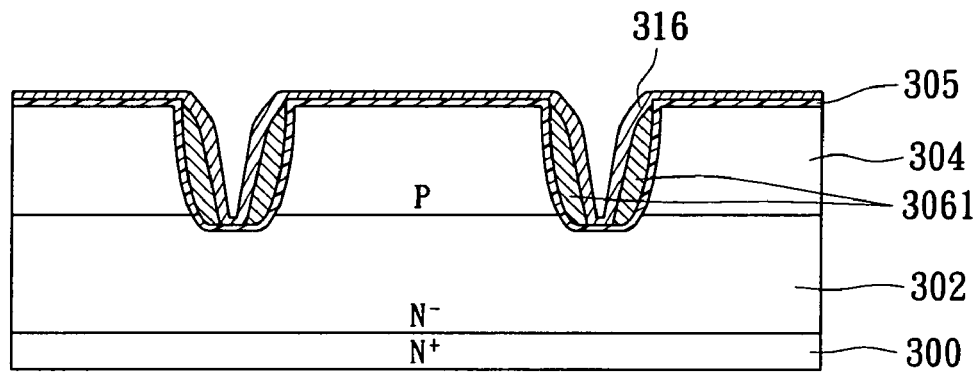
Figure 3F:
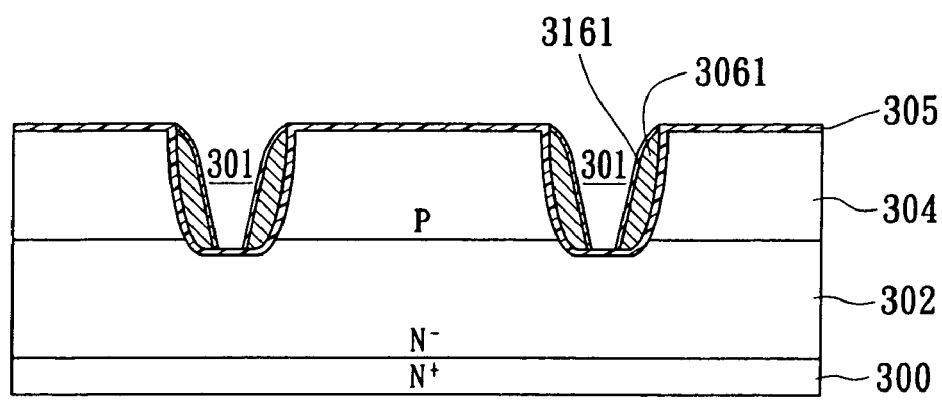

Afterward, referring to FIG. 3E, a metal-salicide layer 3161 is formed on the ploy-silicon spacer 3061. The metal-salicide layer 3161 is formed by the following steps. Firstly, a continuous metal layer 316 is disposed on the body region 304 and the ploy-silicon spacer 3061 as shown in FIG. 3E. Then, a heating step is carried out to have the metal layer 316 react with the ploy-silicon spacer 3061 so as to form a metal-salicide layer 3161 on the ploy-silicon spacer 3061 as shown in FIG. 3F As a preferred embodiment, a continuous metal layer 316 of Ti/TiN may be formed on the poly-silicon spacer 1061 and an rapid thermal processing (RTP) step may be carried out to form a C49 phase TiSi. The excess metal layer 316 is then removed to leave the C49 phase TiSi as the metal salicide layer 3161 on the poly-silicon spacer 3061.

Thereafter, in order to further reduce the resistivity of the metal salicide layer 3161, a high temperature phase transforming step is carried out to transform the C49 phase TiSi into the low resistivity C54 phase TiSi. As a preferred embodiment, the C49 phase TiSi may be transformed into the C54 phase TiSi by using a RTP step. Therefore, the problem of a rising gate resistance due to the decreased cross-section area of the ploy-silicon gate can be compensated by the low resistivity metal-salicide layer 3161.

Figure 3G:
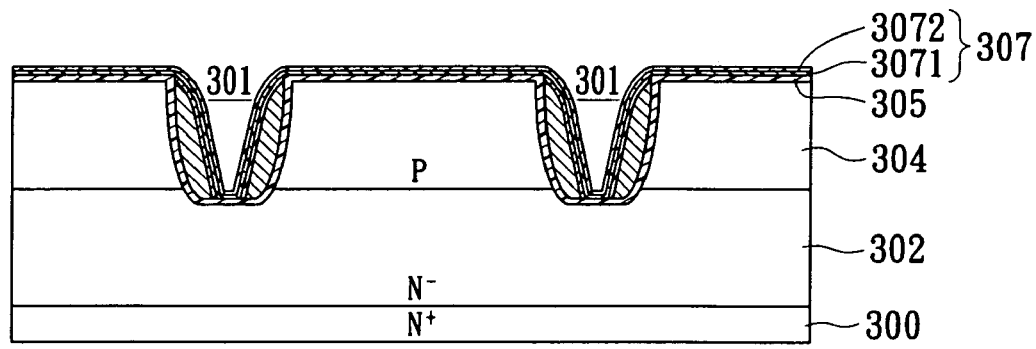

Then, referring to FIG. 3G, a continuous dielectric layer 307 is formed on the first insulating layer 305 and in the trenches 301. The dielectric layer 307 covers the metal-salicide layer 3161 and the bottom surface of the trench 301. In the present embodiment, the dielectric layer 307 includes a silicon nitride layer 3071 and a silicon oxide layer 3072.

Figure 3H:
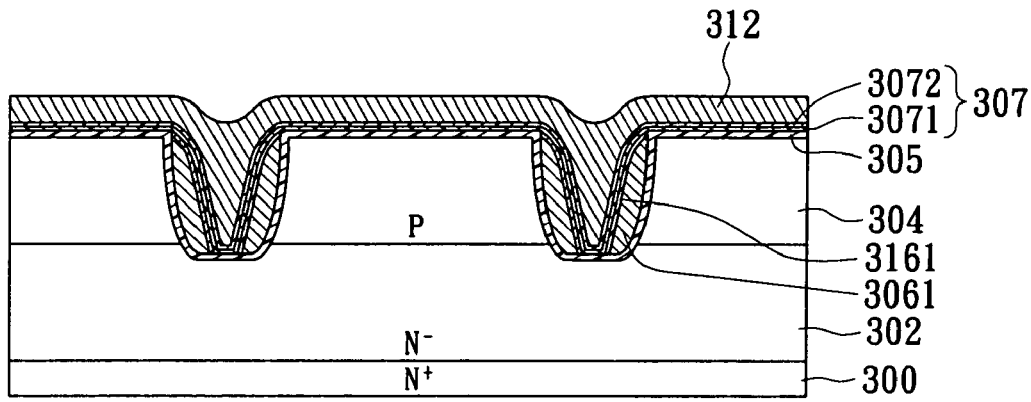
Figure 3I:
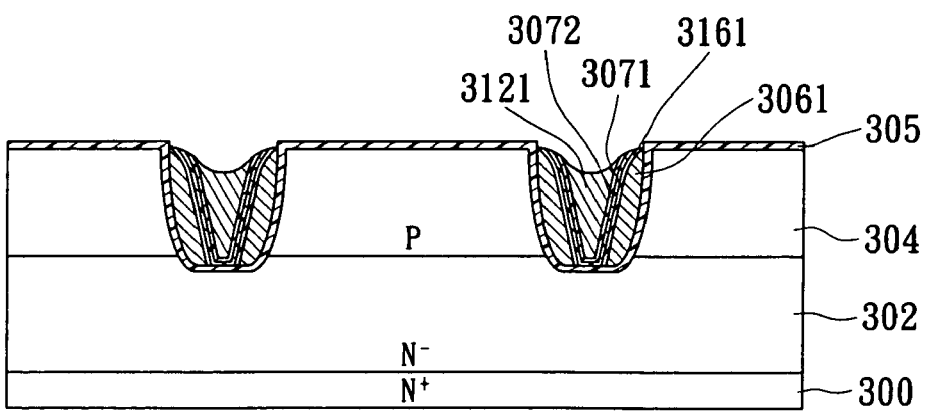

Afterward, as shown in FIG. 3H, a continuous second ploy-silicon layer 312 is formed on the dielectric layer 307 and then an etching process is carried out to remove to the unwanted second ploy-silicon layer 312, the silicon nitride layer 3071, and the silicon oxide layer 3072, but retain the ploy-silicon structure 3121, the silicon nitride layer 3071, and the silicon oxide layer 3072 in the trenches 301. The dielectric layer 307 is provided mainly for isolating the ploy-silicon spacer 3061 and ploy-silicon structure 3121. Therefore, the dielectric layer 307 can be a single silicon oxide layer or a single silicon nitride layer also.

Figure 3J:
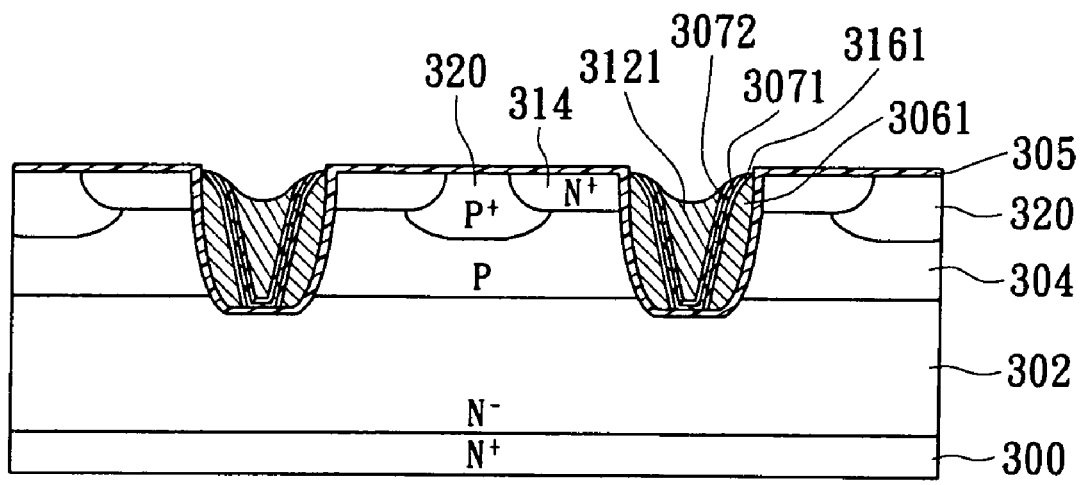
Figure 3K:
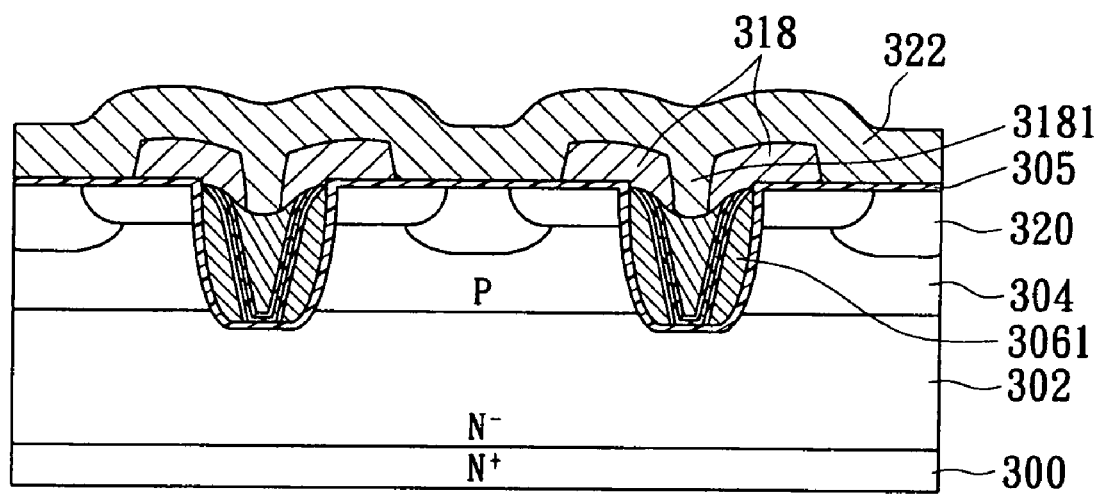

Afterward, referring to FIG. 3J, a source 314 is formed in the body region 304. Then, referring to FIG. 3K, a plurality of silicate glass structures 318, such as the BPSG structures, are formed on the ploy-silicon spacer 3061 and the silicate glass structure 318 has a contact window 3181 for exposing the ploy-silicon structure 3121 in the trench 301. Thereafter, a source metal layer 322 is formed over the silicate glass structure 318 to connect to the ploy-silicon structure 3121 through the contact window 3181. Since the ploy-silicon structure 3121 is connected with the source electrode rather than the gate electrode, the capacitance between gate and drain Cgd, which is decided by the poly-silicon spacer 3061, can be decreased.

According to the manufacturing method mentioned above, a trench MOSFET device is provided in the present invention. Take the trench MOSFET device provided by using the manufacturing method of the first embodiment for example, the trench MOSFET device with low gate charge includes a substrate 100 of first conductivity type, an epitaxial layer 102 of first conductivity type, a body region 104 of second conductivity type, a plurality of trenches 101, a first insulating layer 105, a poly-silicon spacer 1061, and a dielectric structure 1101. The epitaxial layer 102 of first conductivity type is located on the substrate 100. The body region 104 of second conductivity type is located in the epitaxial layer 102. The trenches 101 are located in the epitaxial layer 102 and extend from an upper surface of the body region 104 downwards for penetrating through the body region 104. The first insulating layer 105 is formed on the body region 104 and an inner surface of the trench 101. The ploy-silicon spacer 1061 is formed on the first insulating layer 105 at the side-wall of the trench 101. The dielectric structure 1101 is formed in the lower portion of the trench 101 to cover the exposed bottom surface of the trench 101.

In summary, the present invention has the following advantages.

1. The switching rate is improved. According to the above mentioned embodiment, the overlapped area between the poly-silicon gate and the bottom surface of the trench can be effectively reduced. Therefore, gate charge Qgd and gate to drain capacitance Cgd can be lowered. Furthermore, the rising resistance due to the smaller cross-section area of the poly-silicon spacer is compensated by the lower resistivity metal-salicide layer and/or the extra poly-silicon structure connected to the ploy-silicon spacer. As a result, switching loss is reduced because of the smaller gate to drain capacitance and the smaller gate resistance, and thereby the switching rate can be improved.

2. A thicker oxide layer formed at the bottom of the trench is usually provided in the traditional MOSFET devices for decreasing gate to drain capacitance Cgd. However, the thicker bottom oxide layer may hinder the accumulation of charges below the trench. On the contrary, the poly-silicon spacer of the present invention extends along the side wall to the bottom of the trench. There is only a thin dielectric layer located between the poly-silicon spacer and the epitaxial layer. Therefore, the accumulation speed of charges in the present invention is faster and the switching rate can be enhanced.

The above-mentioned descriptions represent merely the preferred embodiment of the present invention, without any intention to limit the scope of the present invention thereto. Various equivalent changes, alternations or modifications based on the claims of present invention are all consequently viewed as being embraced by the scope of the present invention.

What is claimed is:

1. A method for manufacturing trench MOSFET device with low gate charge comprising:
   providing a substrate of first conductivity type;
   forming an epitaxial layer of first conductivity type on the substrate;
   forming a body region of second conductivity type in the epitaxial layer, wherein the body region extends downwards from an upper surface of the epitaxial layer;
   forming a plurality of trenches in the epitaxial layer, and the trenches penetrating the body region;
   forming a first insulating layer on an inner surface of the trench;
   forming a ploy-silicon spacer on the first insulating layer at a side-wall of the trench;
   forming a dielectric structure in a lower portion of the trench; and
   forming a ploy-silicon structure on the dielectric structure, and the poly-silicon structure connecting with the ploy-silicon spacer.

2. The method according to claim 1, wherein the step of forming the ploy-silicon spacer further comprises steps of:
   forming a continuous ploy-silicon layer on the body region and the inner surface of the trench; and
   etching the continuous ploy-silicon layer by an anisotropic etching process to form the poly-silicon spacer on the first insulating layer at the side-wall of the trench.

3. The method according to claim 1, wherein the step of forming a dielectric structure further comprises steps of:
   forming a first dielectric layer on the poly-silicon spacer and a bottom of the trench;
   forming a second dielectric layer on the first dielectric layer, and the second dielectric layer filling at least the lower portion of the trench;
   etching the second dielectric layer to form the dielectric structure surrounded by the first dielectric layer in the lower portion of the trench; and
   removing the exposed first dielectric layer.

4. The method according to claim 3, wherein the second dielectric layer is etched by using the first dielectric layer as an etching-stop layer.

5. The method according to claim 1, further comprising a step of forming a metal-salicide layer on the ploy-silicon structure after the step of forming the ploy-silicon structure in the trench.

6. A method for manufacturing trench MOSFET device with low gate charge comprising:
   providing a substrate of first conductivity type;
   forming an epitaxial layer of first conductivity type on the substrate;
   forming a body region of second conductivity type in the epitaxial layer, wherein the body region extends downwards from an upper surface of the epitaxial layer;
   forming a plurality of trenches in the epitaxial layer, and the trenches penetrating the body region;
   forming a first insulating layer on an inner surface of the trench;
   forming a ploy-silicon spacer on the first insulating layer at a side-wall of the trench;
   forming a metal-salicide layer on the ploy-silicon spacer;
   forming a dielectric layer covering the metal-salicide layer and a bottom surface of the trench; and
   filling the trench with a ploy-silicon structure.

7. The method according to claim 6, wherein the step of forming the ploy-silicon spacer further comprises steps of:
   forming a continuous ploy-silicon layer on the body region and the inner surface of the trench; and
   etching the continuous ploy-silicon layer by an anisotropic etching process to form the ploy-silicon spacer on the first insulating layer at the side-wall of the trench.

8. The method according to claim 6, wherein the dielectric layer includes a silicon nitride layer and a silicon oxide layer.

9. The method according to claim 6, after the step of filling the trench with a ploy-silicon structure further comprising steps of:
   forming a plurality of silicate glass structures on the ploy-silicon spacers, wherein each silicate glass structure has a contact window for exposing the ploy-silicon structure in the trench; and
   forming a source metal layer connected with the ploy-silicon structure via the contact window.

10. A method for manufacturing trench MOSFET device with low gate charge comprising:
    providing a substrate of first conductivity type;
    forming an epitaxial layer of first conductivity type on the substrate;
    forming a body region of second conductivity type in the epitaxial layer, wherein the body region extends downwards from an upper surface of the epitaxial layer;
    forming a plurality of trenches in the epitaxial layer, and the trenches penetrating the body region;
    forming a first insulating layer on an inner surface of the trench;
    forming a ploy-silicon spacer on the first insulating layer at a side-wall of the trench;
    forming a metal-salicide layer on the ploy-silicon spacer;
    forming a plurality of silicate glass structures filled in the trenches and the silicate glass structure covering the ploy-silicon spacer.

* * * * *